United States Patent
Fackelmeier et al.

(10) Patent No.: US 9,921,281 B2
(45) Date of Patent: Mar. 20, 2018

(54) SHIELDING FOR A MAGNETIC RESONANCE TOMOGRAPHY DEVICE AND MAGNETIC RESONANCE TOMOGRAPHY DEVICE EQUIPPED THEREWITH

(71) Applicants: Andreas Fackelmeier, Thalmässing (DE); Sebastian Martius, Forchheim (DE)

(72) Inventors: Andreas Fackelmeier, Thalmässing (DE); Sebastian Martius, Forchheim (DE)

(73) Assignee: Siemens Aktiengesellschaft, München (DE)

( * ) Notice: Subject to any disclaimer, the term of this patent is extended or adjusted under 35 U.S.C. 154(b) by 1003 days.

(21) Appl. No.: 14/222,609

(22) Filed: Mar. 22, 2014

(65) Prior Publication Data
US 2014/0285202 A1    Sep. 25, 2014

(30) Foreign Application Priority Data
Mar. 22, 2013  (DE) .................. 10 2013 205 150

(51) Int. Cl.
G01R 33/422    (2006.01)
(52) U.S. Cl.
CPC .................. G01R 33/422 (2013.01)
(58) Field of Classification Search
CPC .................................................. G01R 33/422
See application file for complete search history.

(56) References Cited

U.S. PATENT DOCUMENTS

| | | | | |
|---|---|---|---|---|
| 4,712,067 A | * | 12/1987 | Roschmann | G01R 33/34046 324/318 |
| 4,725,781 A | * | 2/1988 | Roschmann | G01R 33/422 324/318 |
| 5,243,286 A | * | 9/1993 | Rzedzian | G01R 33/3854 324/318 |
| 5,381,093 A | | 1/1995 | Kawamoto | |
| 5,680,046 A | | 10/1997 | Frederick et al. | |
| 7,282,918 B2 | | 10/2007 | Freytag | |
| 7,642,780 B2 | | 1/2010 | Diehl et al. | |

(Continued)

FOREIGN PATENT DOCUMENTS

| | | |
|---|---|---|
| DE | 102007014135 | 9/2008 |
| EP | 1746432 | 1/2007 |

OTHER PUBLICATIONS

German Search Report cited in DE 10 2013 205 150.6, dated May 22, 2013.

*Primary Examiner* — Dixomara Vargas
(74) *Attorney, Agent, or Firm* — Lempia Summerfield Katz LLC

(57) ABSTRACT

A shielding for a magnetic resonance tomography device, in the form of a shell of a cylinder, for arrangement radially between a radially outer gradient coil system for generating a magnetic field gradient in an examination space of the MRT device and a radially inner RF coil system for sending and/or receiving RF signals into the examination space and from the examination space, is provided. The shielding includes strips that are arranged on a shielding surface, are electrically conductive and are separated from one another by slits. The strips have respectively angled and/or rounded profile segments to create a two-dimensional pattern of shielding rings on the shielding surface.

20 Claims, 2 Drawing Sheets

(56) References Cited

U.S. PATENT DOCUMENTS

| | | | |
|---|---|---|---|
| 8,022,705 B2* | 9/2011 | Bogdanov | G01R 33/34046 324/318 |
| 2007/0018647 A1 | 1/2007 | Freytag | |
| 2008/0231276 A1 | 9/2008 | Diehl et al. | |

* cited by examiner

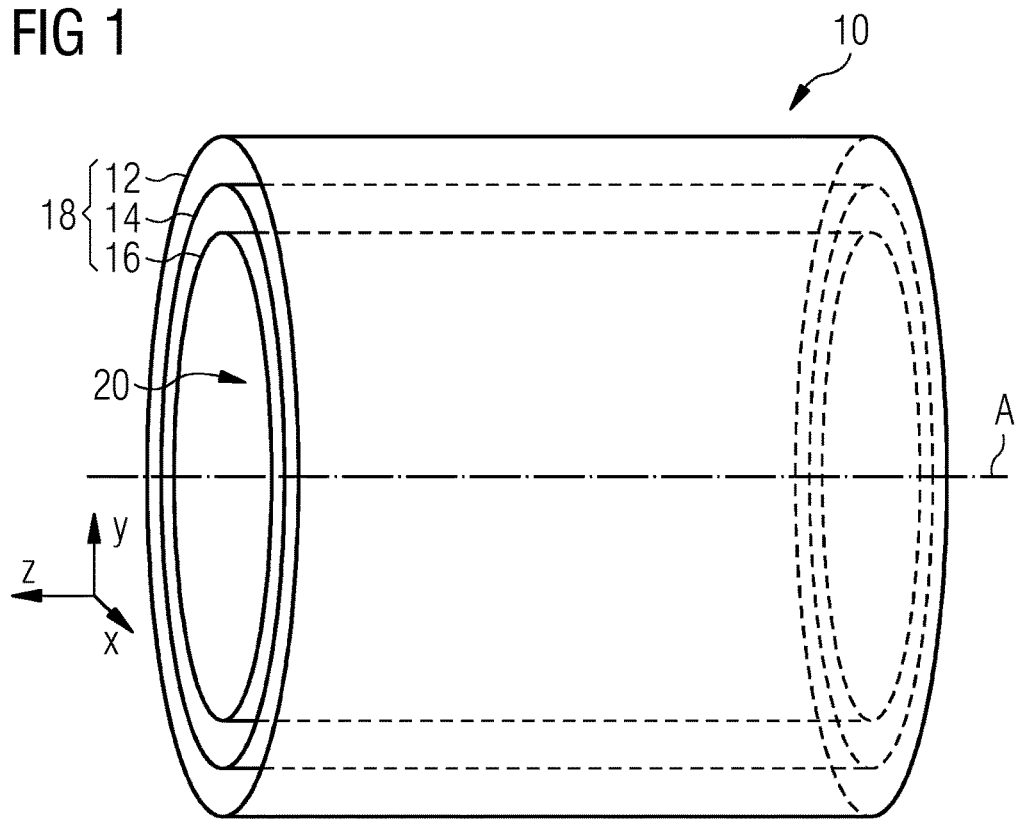
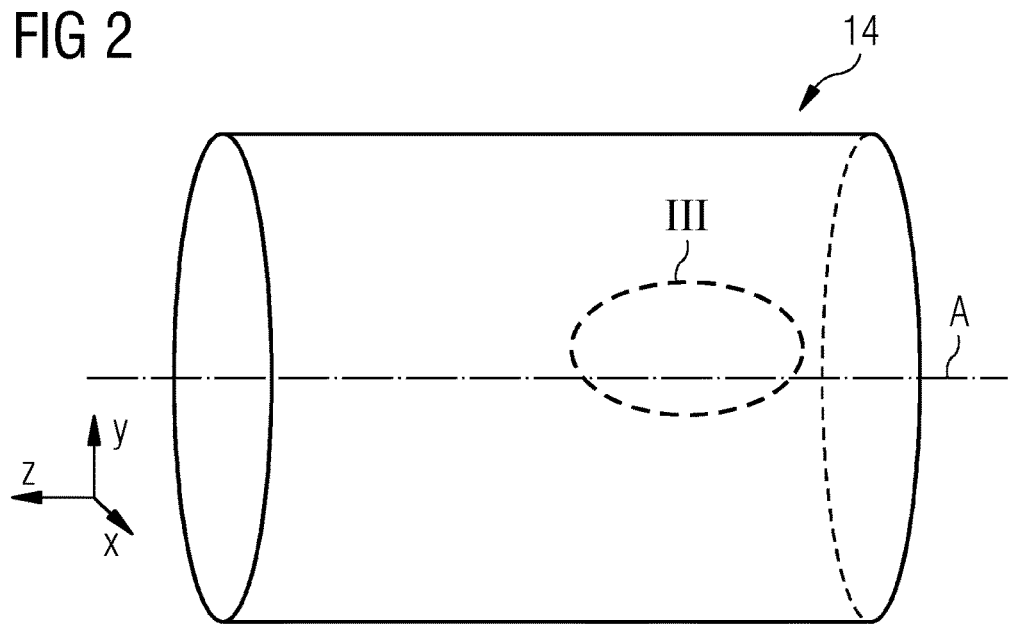

SHIELDING FOR A MAGNETIC RESONANCE TOMOGRAPHY DEVICE AND MAGNETIC RESONANCE TOMOGRAPHY DEVICE EQUIPPED THEREWITH

This application claims the benefit of DE 10 2013 205 150.6, filed on Mar. 22, 2013, which is hereby incorporated by reference in its entirety.

BACKGROUND

The present embodiments relate to a shielding for magnetic resonance tomography (MRT).

A shielding is known, for example, from EP 1 746 432 B1.

In the case of MRT devices, resonant or resonantly connected loop antennas of relatively high quality may be used, for example, for sending radio frequency (RF) signals, on one or more "MRT frequencies", to excite nuclear spins in an object or patient arranged in the examination space. Depending, for example, on the strength of the static "main magnetic field" used in the MRT, the MRT frequencies, for example, may be in the MHz range (e.g., in the range of approximately 100 to 600 MHz). One or a plurality of such RF antennas form an RF coil system for sending the RF excitation signals into the examination space. The same RF coil system may also be used for receiving the RF response signals from the examination space that occur in the course of the MRT examination.

The shielding serves the purpose of shielding the RF coil system from the components of the MRT device lying behind the RF coil system (e.g., radially further outward), which may otherwise adversely affect the electrical properties of the RF loop antennas (e.g., quality). These components include, for example, the gradient coil system (e.g., formed by a plurality of coils) for generating the magnetic field gradient in the examination space that is required for spatial resolution in the MRT examination.

When sending the RF signals, the shielding advantageously reduces losses in the region of the components and structures lying behind and consequently brings about a certain focusing of the sending field into the radially inner examination space.

The shielding according to the prior art cited above has for this purpose a plurality of electrically conductive strips that run in a straight line and parallel to one another and are separated from one another by slits. By using capacitive bridges of the slits, the lowest natural resonance of the strip arrangement below the natural resonance of the excited nuclei or MRT frequencies may be achieved. At the same time, a good shielding effect may be provided.

The provision of slits on the shielding surface or a not overly large width of the individual strips is of importance to the extent that it prevents excessive development of heat of the shielding being caused by eddy currents generated by the gradient coil system in the electrically conductive material. The gradient coil system generates magnetic fields or magnetic field gradients that may change over time with a frequency in the kHz range.

When the known strip shield is used, high-quality RF loop antennas may be provided at a relatively great distance from this shielding in order that the quality of the RF antennas is not influenced so much by the shielding. However, this reduces the space available for the object of examination or the patient.

One possibility of placing a high-quality RF antenna closer to the known strip shield would be to bridge the slits on the shielding surface at suitable points with capacitances such that the mirror currents generated on the loop antennas may flow more or less unhindered on the shielding surface.

With loop antennas of relatively large dimensions, this possibility is not very practicable in the case of the known strip shield, since very many capacitances or capacitor elements would be required for this. Due to the series connection of these capacitances, the individual capacitance values would have to be very great (e.g., in order to allow a mirror current flow that is as unhindered as possible at the MRT frequency concerned). This configuration also allows the formation of undesired resonances, which may likewise reduce the quality of the loop antenna.

SUMMARY AND DESCRIPTION

The scope of the present invention is defined solely by the appended claims and is not affected to any degree by the statements within this summary.

The present embodiments may obviate one or more of the drawbacks or limitations in the related art. For example, shielding having good performance properties with a simple configuration is provided.

In one embodiment, a shielding by the strips having respectively angled and/or rounded profile segments to create a two-dimensional pattern of shielding rings on the shielding surface is provided.

The shielding according to one or more of the present embodiments may act as a reflector for the RF coil system (e.g., for a two-dimensional arrangement of resonant loop antennas, a reflector in which mirror currents acting for this are induced). In the case of one or more of the present embodiments, the provision of the two-dimensional pattern of shielding rings allows these mirror currents to flow relatively efficiently or unhindered (e.g., if the two-dimensional pattern of arrangement of the shielding rings corresponds to that of the loop antennas ("1:1 assignment")).

In a development in which individual loop antennas of the RF coil system are arranged in a two-dimensional pattern, the two-dimensional pattern of shielding rings is provided correspondingly on the shielding surface of the shielding such that a respectively assigned shielding ring of the shielding is formed for individual loop antennas (e.g., in order to allow the mirror current of the loop antenna concerned to flow as unhindered as possible in this ring).

The strips of the electrically conductive material (e.g., of metal such as a copper alloy) that are provided, for example, by the angled and/or rounded profile segments to create the shielding rings may be shaped in a wide variety of ways.

For the already mentioned suppression of excessive heat development in the shielding, the strips may not have at any point a strip width that is overly large. In practice, this may be provided by maintaining a "maximum strip width" that is dependent on the properties of the remaining device components or operating frequencies. It is advantageous in this connection if the strips have an at least approximately uniform strip width, which may then be chosen as approximately corresponding to this maximum strip width. The term "at least approximately uniform" may include, for example, the case where a resultant maximum strip width, measured from the center point of a shielding ring in a radial direction (e.g., with respect to the shielding ring), is greater than a minimum strip width measured in this way by at most 30% (e.g., at most 20%).

For all the shielding rings, the minimum and maximum strip widths determined for the individual shielding rings may be less than or equal to a previously fixed maximumpermissible strip width, which may, for example, be of the order of magnitude of a few cm (e.g., between 2 and 8 cm).

For the shaping of the strips running in an angled and/or rounded manner to create the shielding rings (e.g., in the case where the strips are formed from one and the same material (e.g., seen over the profile of the ring)), as far as possible, the gradient coil system may not cause any eddy currents that flow unhindered in the individual shielding rings. This problem is countered by the shielding rings being respectively interrupted in profile at at least one point. In one embodiment, each such interruption may be bridged in a simple way with a capacitance in order to allow a mirror current flow that is as unhindered as possible to continue over the profile of the ring. This bridging has the effect that the ring represents a resonant circuit, the natural resonance of which may be so low that the quality of the RF coil system or of the individual RF antennas is not excessively reduced. For this reason, the capacitance value may not be overly small. In practice, a suitable capacitance value may be easily found to the extent that the typical MRT frequencies (e.g., order of magnitude of 100 MHz or more) are much greater than the typical gradient frequencies (e.g., order of magnitude approximately a few kHz to a few 10 kHz) that are caused by the gradient coil system. A suitably chosen capacitance may represent a short circuit for the 100 MHz range, but have a blocking effect in the kHz range.

According to one embodiment, the capacitances that are respectively provided for bridging slits or interruptions of the shielding rings are formed as an arrangement of multiple capacitors lying next to one another (e.g., arranged distributed over the strip width). In this way, a "bottleneck" that otherwise occurs in the ring profile (e.g., in comparison with the arrangement of a single capacitor) is advantageously avoided.

SMD capacitors or other capacitors that take up less space, which may, for example, be soldered onto the corresponding strip ends, may be used as bridging capacitors. With an arrangement of multiple capacitors next to one another, for example, at least three capacitors (e.g., at least five capacitors) may be used for bridging the same interruption.

As an alternative to the arrangement of multiple capacitors next to one another, the two strip ends concerned may be arranged as overlapping one another, but with a dielectric layer between, in order to create an inherent capacitance at this interruption point.

The interruptions in the profile of the shielding rings may be relatively small or short in comparison with the strip width and/or in comparison with the length of the shielding ring (e.g., measured along the profile of the ring). For example, the length of the interruption (e.g., "gap width") may be less than the strip width at the point of the interruption by a factor of over 10 (e.g., over 50). The strip width may be less than the length of the ring profile concerned (e.g., measured along the center line of the ring) by at least a factor of 5.

In one embodiment, the shielding rings are arranged at least in certain segments as adjoining one another to form shared ring profile segments. In one embodiment, the surface area available may be occupied as densely as possible with many shielding rings. In a development, the shielding rings are arranged, seen over an entire length, as adjoining adjacent shielding rings to form shared ring profile segments. In other words, there are no longer any gaps between the shielding rings.

In one embodiment, the shielding rings are arranged on a two-dimensional (in the mathematical sense) grid (e.g., a square, rectangular or hexagonal grid) on the shielding surface. Since the shielding surface is in the form of a shell of a cylinder, the term "shielding surface" used for this refers to the form of this surface area developed into a plane.

The actual ring profile of the individual shielding rings may be adapted, for example, to the two-dimensional grid that is actually used in order, with an approximately uniform strip width of the individual rings, to provide a particularly compact occupancy of the surface area available with the shielding rings, without gaps between the shielding rings. Additionally or alternatively, the arrangement of the shielding rings may be provided the same as an arrangement of individual RF loop antennas.

If a hexagonal grid is used, shielding rings of a hexagonal profile may accordingly be provided, for example. In the case of a rectangular grid, accordingly rectangular ring profiles may be provided.

For example, with an arrangement of the shielding rings on a two-dimensional grid, the individual shielding rings may have an identical shape. For example, in the case of a 1:1 assignment of the shielding rings to corresponding antenna loops of the RF coil system (e.g., the same pattern of arrangement), this may be provided if the individual RF antenna elements are also formed the same. In other embodiments, the two-dimensional pattern of the shielding rings has differently shaped shielding rings.

In one embodiment, the shielding also has on the shielding surface electrically conductive structures respectively arranged within one of the shielding rings. This advantageously allows the shielding effect to be further improved, in that the shielding gap otherwise within every shielding ring is in this way closed to a certain extent.

In the simplest case, an electrically conductive patch (e.g., a contiguous conductive surface area that has an at least approximately round or polygonal form and/or occupies the region within the shielding ring at least approximately completely (e.g., with a small distance from the inner contour of the shielding ring)) is provided within the shielding ring concerned.

If such a shielding patch of a relatively large surface area is arranged within a shielding ring, this may give rise to the problem that the gradient coil system generates, in this patch, eddy currents that lead to a disadvantageous development of heat. This occurs, for example, whenever a circle (e.g., an imaginary circle) with a diameter of more than the "maximum strip width" explained above is covered by the patch. To reduce such eddy currents, one or more clearances (e.g., one or more slits) may be provided in the patch. One slit running in a radial direction (e.g., with respect to the patch) may be sufficient for this.

In one embodiment, the shielding has, on the shielding surface, electrically conductive patches that are arranged respectively within one of the shielding rings, occupying the region within the respective shielding ring (e.g., to a large extent or substantially completely). Additionally or alternatively, the electrically conductive patches are provided with at least one clearance (e.g., at least one narrow slit) to reduce eddy currents.

The shielding surface of the shielding may be provided, for example, on an inner circumferential surface of an electrically insulating shielding carrier in the form of a shell of a cylinder, which in the installed state is arranged radially between the gradient coil system with further components of the MRT device, such as electronic components and components for generating a static "main magnetic field" (e.g., radially outer) and the RF coil system (e.g., radially inner). The shielding carrier may be formed, for example, from a material that may be used for the production of circuit boards or printed circuit boards.

In one embodiment, the shielding also has a further shielding surface (e.g., at a relatively small distance such as a few mm from the shielding surface), further electrically conductive strips and/or patches that are separated from one another by slits being arranged on the further shielding surface. Such a further shielding surface may be provided, for example, on the outer circumferential surface of the aforementioned shielding carrier. The circuit carrier may have a thickness of, for example, less than 10 mm. The shielding pattern of shielding rings and possibly shielding patches on both sides of the shielding carrier may be electrically connected to one another at one or more points.

The further strips may, for example, also have respectively angled and/or rounded profile segments to create a two-dimensional pattern of further shielding rings on the further shielding surface. Under some circumstances, in the case of this further shielding surface, the further strips may have an at least approximately uniform strip width, and/or the further shielding rings are respectively interrupted in their profile at at least one point. Additionally or alternatively, the further shielding rings are arranged on a two-dimensional grid (e.g., a grid of a type corresponding to the type of grid on which the shielding rings of the first-mentioned shielding surface are arranged).

The further strips or further patches arranged on the further shielding surface may not be provided congruently in relation to the strips or patches of the first shielding surface. The regions of the first shielding layer at which there are no strips or patches (but, for example, slits) are covered by the further strips or further patches.

An example of such a configuration or arrangement of further strips and further slits of the second shielding surface is that the further strips respectively have angled and/or rounded profile segments to create a two-dimensional pattern of further shielding rings on the second shielding surface. These further shielding rings are arranged in such a way that the further shielding rings cover regions of the first shielding surface that occur in the manner of a ring respectively between a patch and a shielding ring of the first shielding surface that surrounds this patch.

As a departure from the embodiment explained above, in which a further shielding surface (e.g., second shielding surface) is arranged on a rear side of the shielding carrier used for the first shielding surface, a separate shielding carrier may also be provided for forming a second shielding layer. Alternatively, the first shielding layer designed according to one or more of the present embodiments may be combined with a shielding layer of a conventional type that is present in any case in the structural design of the MRT device concerned.

In one embodiment, an MRT device that is equipped with a shielding of the type described is provided. The shielding according to one or more of the present embodiments may be used as an alternative or in addition to a shielding of a conventional type of the MRT device concerned.

BRIEF DESCRIPTION OF THE DRAWINGS

FIG. 1 shows one embodiment of a magnetic resonance tomography (MRT) device;

FIG. 2 shows one embodiment of a shielding used in the MRT device from FIG. 1;

DETAILED DESCRIPTION

Figure 3:
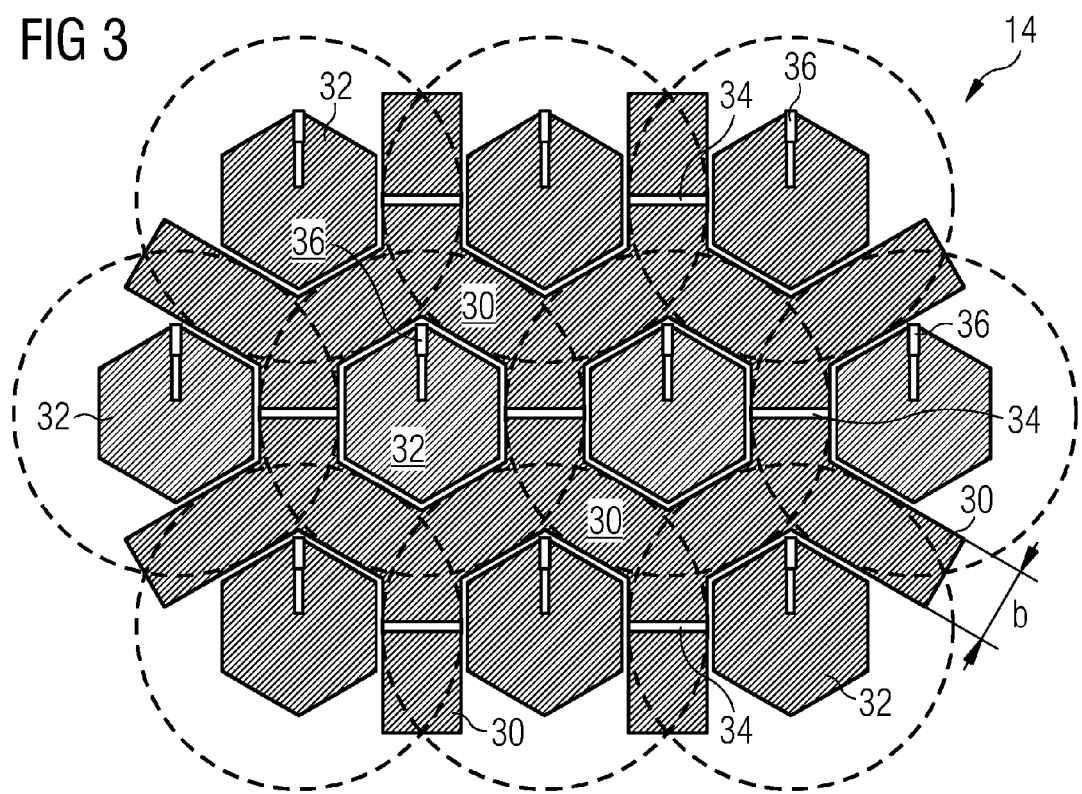
FIG. 3 shows an exemplary two-dimensional pattern of shielding rings and shielding patches provided on a first shielding surface of the shielding from FIG. 2.

FIG. 1 shows one embodiment of a magnetic resonance tomography (MRT) device 10 including a gradient coil system 12, a shielding 14 and a radio frequency (RF) coil system 16.

These device components 12, 14 and 16 are structurally assembled in an MRT examination tube 18 that extends along an MRT tube axis A and surrounds an MRT examination space for a patient to be examined.

During operation of the MRT device 10 represented, a main magnetic field for nuclear spin alignment runs parallel to the MRT tube axis A, or in the z direction according to the system of coordinates that is depicted in FIG. 1.

The gradient coil system 12 serves to generate a magnetic field gradient in the examination space 20 of the device 10 in order thereby to make a spatial resolution of the MRT signals measured in the MRT examination using the RF coil system 16 possible in a known way.

The RF coil system 16 includes, for example, a plurality of loop antennas of high quality and serves in the exemplary embodiment represented for sending RF excitation signals into the examination space 20 and for receiving resultant RF nuclear spin response signals from the examination space 20.

The representation of FIG. 1, in which the components 12, 14 and 16 are represented as concentric shells of a cylinder, is intended to illustrate the spatial arrangement of the components 12, 14 and 16 in relation to one another and with respect to the examination space 20.

FIG. 2 shows one embodiment of the shielding 14 of the MRT device 10 from FIG. 1, which also has a shape in the form of a shell of a cylinder.

The shielding 14 is formed by a shielding carrier in the form of a shell of a cylinder. On an inner side and an outer side of the shielding 14, electrically conductive structures are respectively formed. This is explained below with reference to FIG. 3 (inner side) and FIG. 4 (outer side).

FIG. 3 shows in a representation of a development a partial region of the shielding 14 that is identified in FIG. 2 by III, or the mentioned structuring of conductive regions (represented by hatching in FIG. 3) on the radially inner side of the shielding 14.

The shielding 14 includes, on the radially inner side, electrically conductive strips 30 that are arranged on a shielding surface and, as represented, respectively have angled profile segments to create a two-dimensional pattern of shielding rings on the shielding surface.

In the example represented, each shielding ring (cf., circles depicted by dashed lines in FIG. 3) is made up of six 30-degree angled portions arranged in a row, so that each shielding ring has an altogether hexagonal shape or a hexagonal ring profile.

The width of the strips between the angled portions is denoted in FIG. 3 by b and, in the example represented, is, for example, approximately 5 cm.

In the example represented, the hexagonal shielding rings are arranged on a two-dimensional hexagonal grid on the shielding surface. The shielding rings in this grid arrangement are arranged over the entire circumference thereof as adjoining adjacent shielding rings to form shared ring profile segments.

The "shielding surface" mentioned is the plane of development used for the developed view from FIG. 3, corresponding to the plane of the drawing of FIG. 3. The two-dimensional shielding pattern represented in FIG. 3 is more or less curved, in a way corresponding to the curvature of the shape of the shielding 14 in the form of a shell of a cylinder (cf., FIG. 2).

Apart from the strips 30 partially joined to one another over the shared ring profile segments, the two-dimensional pattern of the shielding 14 also includes the electrically conductive patches 32 that are likewise represented by hatching in FIG. 3 and are arranged on the shielding surface respectively within one of the shielding rings formed by the strips 30 (e.g., at the center of the circles depicted by dashed lines in FIG. 3).

The strips 30 and the patches 32 are formed from the same material with good electrical conductivity (e.g., copper).

The patches 32 have a hexagonal shape, in adaptation to the likewise hexagonal inner circumference of the individual hexagonal shielding rings, so that in each case only a relatively small hexagonal-annular slit remains between the patches 32 and the shielding rings.

Represented in FIG. 3 as small rectangular boxes, bridging capacitances are provided for capacitive bridging in each case of a relatively narrow slit in the regions in which these slits bring about a reduction in undesired eddy currents due to the magnetic fields generated by the gradient coil system. As shown in FIG. 3, two such slits, and consequently interruptions of the ring profile, are provided in the ring profile of each shielding ring and are bridged by a respective bridging capacitance 34 (e.g., horizontally elongated small boxes in FIG. 3). Taking into account the shared ring profile segments of the individual shielding rings, a number of only one ring interruption per shielding ring or one bridging capacitance per shielding ring is obtained.

The individual bridging capacitances 34 may be respectively formed as a capacitor, or an arrangement of multiple capacitors next to one another. In one embodiment, such bridging capacitances 34 may be realized by an overlap of the two strip ends concerned with a dielectric interposed.

Since, in the example represented, the patches 32 have a size that exceeds the "maximum strip width b" that may be provided for eddy current reduction or eddy current limitation, the patches 32 are also provided with eddy-current-reducing slits that are likewise bridged by corresponding bridging capacitances 36 (e.g., vertically elongated small boxes in FIG. 3) in order thereby not to interrupt the mirror current flow.

Measurements with a test setup of a shielding 14 of the type shown in FIG. 3 have shown a considerable increase in the quality of an adjacently arranged RF coil system in comparison with the use of a conventional shield (e.g., of the strip shield mentioned at the background).

In many cases, the shielding according to one or more of the present embodiments may be adapted advantageously well to an RF coil system that is formed from a plurality of antenna loops ("loops") arranged next to one another and partially overlapping one another on a two-dimensional pattern. This is also the case, for example, for the exemplary embodiment shown in FIG. 3 if, with this hexagonal pattern of shielding rings, an adaptation to a correspondingly hexagonal arrangement of individual antenna elements is performed (cf., circles depicted by dashed lines in FIG. 3).

The circles depicted by dashed lines in FIG. 3 not only represent imaginary outer contours of the shielding rings, but also the profile of the individual loop antennas of the RF coil system that are arranged adjacent the shielding 14.

FIG. 3 also shows that, with a shielding 14 according to one or more of the present embodiments, such a 1:1 assignment between annular antenna elements and annular shielding rings may be provided in a way in which the individual antenna loops significantly overlap one another, as is usual in the case of known systems (cf., crossing points between the individual antenna profiles). The shielding rings do not appreciably overlap one another, insofar as no crossing points are formed as in the case of the antenna loops. Important here is the strip width that is available for the shielding rings together with the particular aspect that, at least in certain portions, the shielding rings form shared ring profile segments that are adjacent one another.

A further improvement in the shielding effect may be achieved if the shielding 14 is used in combination with at least one further shielding layer. An example of this is the optional patterning of the shielding carrier concerned with further electrically conductive structures on the opposite side. The additional two-dimensional pattern of electrically conductive regions or strips thereby created may be chosen, for example, in adaptation to the two-dimensional pattern of the shielding layer already described. For the pattern according to FIG. 3, such an adapted further pattern on the other side of the shielding carrier is shown in FIG. 4.

Figure 4:
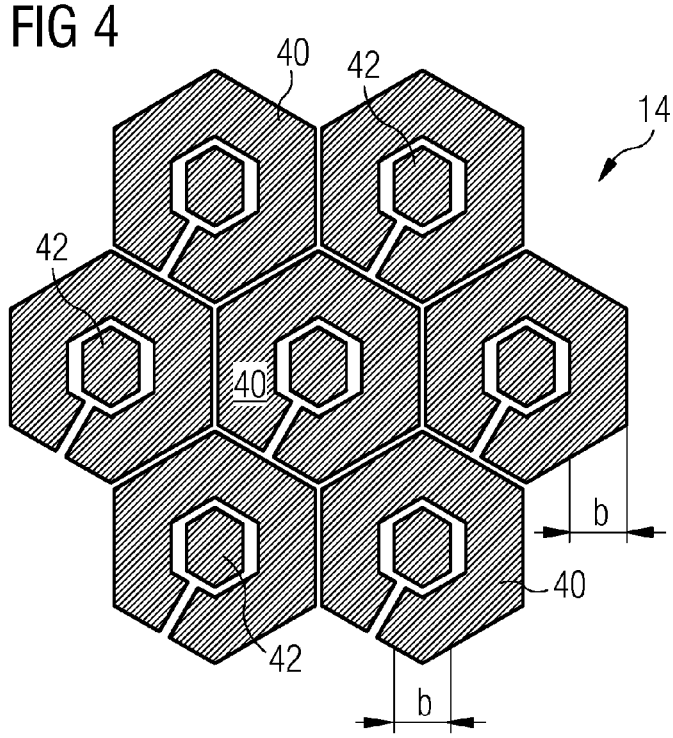
FIG. 4 shows a representation, corresponding to FIG. 3, of an exemplary two-dimensional pattern that is optionally provided on a second shielding surface of the shielding from FIG. 2.

FIG. 4 is a representation corresponding to FIG. 3 of a further shielding surface of the shielding 14, on which electrically conductive strips 40 and electrically conductive patches 42, and likewise again slits separating these conductive regions from one another, are provided.

The shielding rings formed from the strips 40, again in a hexagonal grid arrangement, are dimensioned and arranged with respect to the pattern represented in FIG. 3 such that the gaps remaining between the shielding rings and the hexagonal shielding patches in FIG. 3 are optimally covered.

The slits obtained in the ring profiles from FIG. 3 (e.g., in each case, capacitively bridged) may also be covered by the shielding rings that are shown in FIG. 4, insofar as, though slits (e.g., interruptions) of the ring profile are likewise provided in the case of the shielding rings on FIG. 4, the slits are at a different point (e.g., than the bridged slits in FIG. 3).

The rings in FIG. 4 may also be formed quite generally by angled and/or rounded profile segments of conductive strips with a substantially uniform strip width b, corresponding to the strip width of the pattern according to FIG. 3.

A shielding of a simple shape and nevertheless high quality for arrangement radially between the gradient coil system and the RF coil system is created by one or more of the present embodiments. The reduction in quality of a loop antenna that occurs in the case of MRT devices due to a shielding located in the vicinity is significantly reduced by the shaping according to this shielding. The shielding uses relatively few bridging capacitances. These advantages may be used, for example, for positioning the RF coil system or the individual loop antennas much closer to the shielding than before in order to advantageously increase the space available for the patient in an MRT examination.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A shielding for a magnetic resonance tomography (MRT) device, the shielding comprising:
   a plurality of strips that are arranged on a shielding surface, are electrically conductive, and are separated from one another by slits,
   wherein each strip of the plurality of strips comprises continuous segments with angled, rounded, or angled and rounded profiles,
   wherein a first strip of the plurality of strips is adjacent to a second strip of the plurality of strips and the profiles of the continuous segments of the first strip and the second strip create a two-dimensional pattern of shielding rings on the shielding surface between the first strip and the second strip,
   wherein the shielding is in the form of a shell of a cylinder, and
   wherein the shielding is configured to be arranged radially between a radially outer gradient coil system for generating a magnetic field gradient in an examination space of the MRT device, and a radially inner RF coil system for sending, receiving, or sending and receiving RF signals into the examination space and from the examination space, respectively.

2. The shielding of claim 1, wherein each strip of the plurality of strips has an at least approximately uniform strip width.

3. The shielding of claim 1, wherein the shielding rings are respectively interrupted in profile at at least one point.

4. The shielding of claim 1, wherein the shielding rings are arranged at least in a subset of segments as adjoining one another to form shared ring profile segments.

5. The shielding of claim 1, wherein the shielding rings are arranged on a two-dimensional grid on the shielding surface.

6. The shielding of claim 1, further comprising electrically conductive patches on the shielding surface that are arranged respectively within the shielding rings.

7. The shielding of claim 1, further comprising a further shielding surface, on which further electrically conductive strips, patches, or strips and patches that are separated from one another by slits are arranged.

8. The shielding of claim 2, wherein the shielding rings are respectively interrupted in profile at at least one point.

9. The shielding of claim 8, wherein the shielding rings are arranged at least in a subset of segments as adjoining one another to form shared ring profile segments.

10. The shielding of claim 9, wherein the shielding rings are arranged on a two-dimensional grid on the shielding surface.

11. The shielding of claim 10, further comprising electrically conductive patches on the shielding surface that are arranged respectively within the shielding rings.

12. A magnetic resonance tomography (MRT) device comprising:
   a radially outer gradient coil system for generating a magnetic field gradient in an examination space of the MRT device,
   a radially inner RF coil system for sending, receiving, or sending and receiving RF signals into the examination space and from the examination space,
   a shielding in the form of a shell of a cylinder, for arrangement radially between the outer gradient coil system and the inner RF coil system, the shielding comprising:
      a plurality of strips that are arranged on a shielding surface, are electrically conductive and are separated from one another by slits,
   wherein each strip of the plurality of strips comprises continuous segments with angled, rounded, or angled and rounded profiles, and
   wherein a first strip of the plurality of strips is adjacent to a second strip of the plurality of strips, and the profiles of the continuous segments of the first strip and the second strip create a two-dimensional pattern of shielding rings on the shielding surface between the first strip and the second strip.

13. The MRT device of claim 12, wherein each strip of the plurality of strips has an at least approximately uniform strip width.

14. The MRT device of claim 12, wherein the shielding rings are respectively interrupted in profile at at least one point.

15. The MRT device of claim 12, wherein the shielding rings are arranged at least in a subset of segments as adjoining one another to form shared ring profile segments.

16. The MRT device of claim 12, wherein the shielding rings are arranged on a two-dimensional grid on the shielding surface.

17. The MRT device of claim 12, wherein the shielding further comprises electrically conductive patches on the shielding surface that are arranged respectively within one of the shielding rings.

18. The MRT device of claim 12, wherein the shielding further comprises a further shielding surface, on which further electrically conductive strips, patches, or strips and patches that are separated from one another by slits are arranged.

19. The MRT device of claim 13, wherein the shielding rings are respectively interrupted in profile at at least one point.

20. The MRT device claim 19, wherein the shielding rings are arranged at least in a subset of segments as adjoining one another to form shared ring profile segments.

* * * * *